United States Patent
Haas et al.

(10) Patent No.: US 7,573,393 B2
(45) Date of Patent: Aug. 11, 2009

(54) INTEGRATED FAULT OUTPUT/FAULT RESPONSE DELAY CIRCUIT

(75) Inventors: David J. Haas, Weare, NH (US); Jonathan Lamarre, Pembroke, NH (US); Michael C. Doogue, Manchester, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 405 days.

(21) Appl. No.: 11/672,739

(22) Filed: Feb. 8, 2007

(65) Prior Publication Data

US 2008/0191865 A1 Aug. 14, 2008

(51) Int. Cl.
- G08B 21/00 (2006.01)
- H02H 3/00 (2006.01)
- G01R 31/14 (2006.01)

(52) U.S. Cl. .................. 340/635; 340/641; 340/650; 340/653; 324/509; 324/537; 361/94

(58) Field of Classification Search .............. 340/635, 340/527, 641, 644, 649, 650, 652, 653; 324/500, 324/509, 535, 537, 763, 765; 361/93.1, 93.7, 361/94, 96, 97
See application file for complete search history.

(56) References Cited

U.S. PATENT DOCUMENTS

| | | | |
|---|---|---|---|
| 5,332,973 A | * | 7/1994 | Brown et al. ................. 324/537 |
| 5,469,476 A | | 11/1995 | Liao et al. .................... 375/350 |
| 5,673,028 A | * | 9/1997 | Levy .......................... 340/635 |
| 5,754,383 A | * | 5/1998 | Huppertz et al. ........... 361/93.4 |
| 7,233,161 B2 | * | 6/2007 | Zettler ........................ 324/763 |

FOREIGN PATENT DOCUMENTS

| | | |
|---|---|---|
| JP | 56019223 | 2/1981 |
| JP | 59103422 | 6/1984 |
| JP | 07193477 | 7/1995 |

OTHER PUBLICATIONS

PCT/US2008/050569 International Search Report dated Jun. 11, 2008.

* cited by examiner

*Primary Examiner*—Toan N Pham
(74) *Attorney, Agent, or Firm*—Daly, Crowley, Mofford & Durkee, LLP

(57) ABSTRACT

A time delay fault device includes an integrated circuit (IC) having an electronic circuit having a fault indicator signal output and a time delay circuit having an input connected to the fault indicator signal output and an output to provide a delayed fault indicator signal output, the time delay circuit being responsive to an external voltage from a resistor capacitor network coupled to the delayed fault indicator signal output to set the time delay of the delayed fault indicator signal.

6 Claims, 2 Drawing Sheets

INTEGRATED FAULT OUTPUT/FAULT RESPONSE DELAY CIRCUIT

FIELD OF THE INVENTION

This invention relates generally to an integrated circuit having a fault delay circuit and more particularly to a fault delay circuit using a single pin of an integrated circuit to provide a fault indication logic output and a user definable latch delay time period for variable high speed fault detection.

BACKGROUND OF THE INVENTION

It is often desirable in electronic applications to provide a fault indication when certain parameters are met. In high speed applications, high speed fault detection presents a problem since noise or other phenomenon may appear as an erroneous fault indication. Using filtering techniques to reduce the noise may introduce an error in the fault measurement by slowing down the ability to detect the fault. Because of this, it is undesirable to use filtering techniques to reduce unwanted noise.

One known solution to reduce erroneous fault indications is to provide a fault delay circuit at the output of the fault indication circuit. With such an arrangement, the output of the fault indication circuit is examined and unless the fault indication exists for a period of time longer than a predetermined period of time, the output of the fault delay circuit does not change from a no fault indication to an existing fault indication. In known integrated circuits to accomplish the latter, one pin of the integrated circuit is used to set the predetermined period of time for the delay in a particular application and a second pin is used to provide the fault indication signal. With the need to reduce package size and die area, yet provide more capability with an integrated circuit, it is desirable to reduce the pin count to accomplish fault indication.

SUMMARY OF THE INVENTION

In accordance with the present invention, a time delay fault device includes an integrated circuit (IC) having an electronic circuit having a fault indicator signal output and a time delay circuit having an input connected to the fault indicator signal output and an output to provide a delayed fault indicator signal output, wherein the time delay circuit is responsive to an external reference signal from a resistor capacitor network coupled to the delayed fault indicator signal output to set the time delay of the delayed fault indicator signal. With such an arrangement, a time delay fault signal can be provided at an output pin of an integrated circuit and the period of the time delay can be set by using an external capacitor connected to the same pin.

In accordance with the present invention, the time delay circuit includes a field effect transistor having a gate, a drain connected to ground, and a source connected to the output of the time delay circuit; a latch having an input and a switchable output connected to the gate of the field effect transistor; and a comparator having an output connected the input of the latch and a first and a second input, the first input connected to an internal reference signal and the second input connected to the output of the time delay circuit. With such an arrangement, when the input signal to the time delay circuit changes from a high voltage to a low voltage, the effect of that change at the output of the time delay circuit can be delayed for a period of time as set by using an external capacitor connected to the output of the time delay circuit.

In accordance with the present invention, the time delay fault device further includes a resistor capacitor network external to the integrated circuit comprising a capacitor connected in series with a resistor to complete the time delay circuit. With such an arrangement, an external reference signal is available to the time delay circuit at the output pin to complete the time delay fault device.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1:
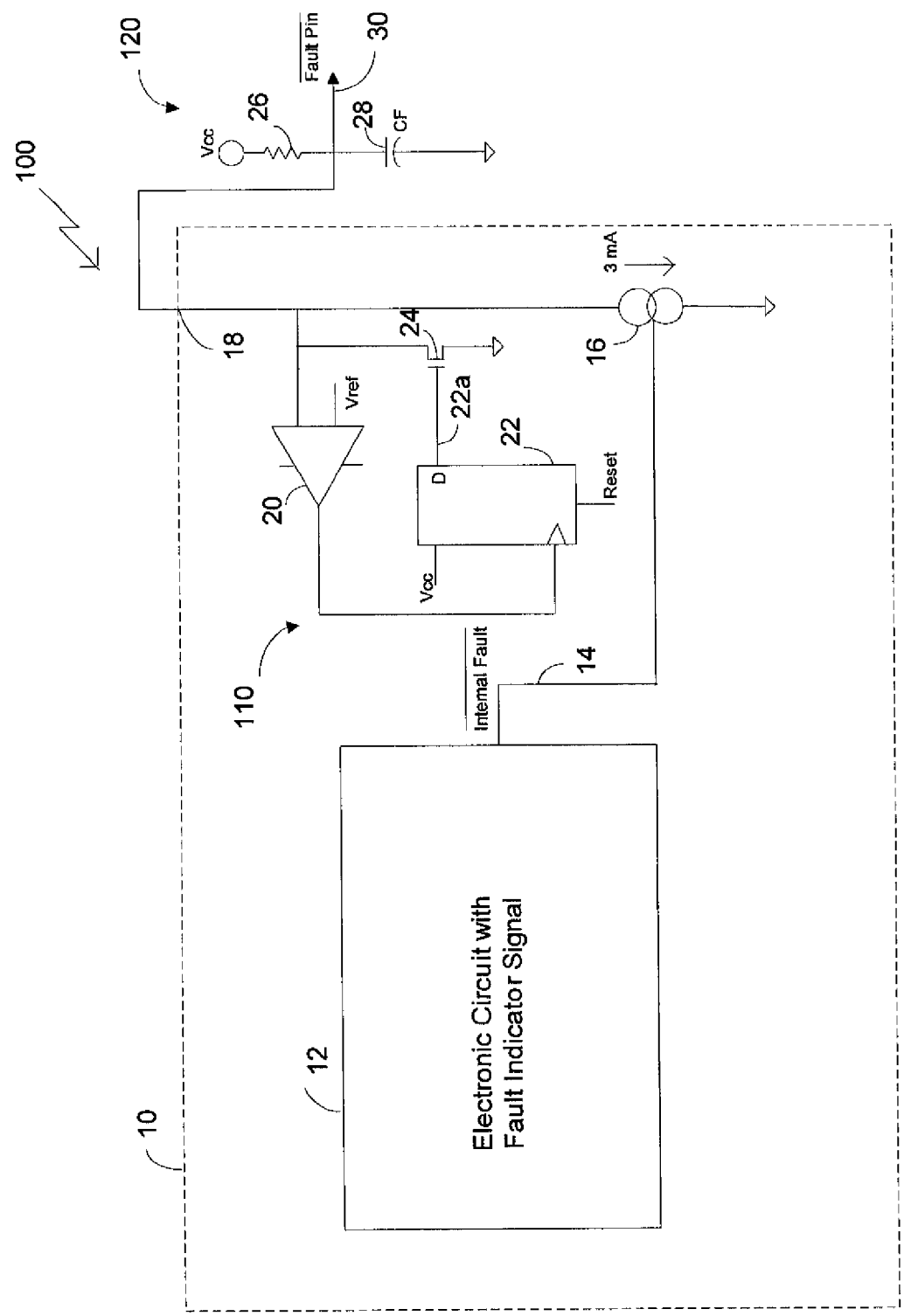
FIG. 1 is a diagram of an integrated circuit having a time delay circuit according to the invention.

In accordance with the present invention, FIG. 1 is an illustration of a time delay circuit that may be configured mostly within an integrated circuit to provide a time delay for a fault indicator signal to reduce erroneous fault indications in an electronic circuit.

Integrated circuit 10 having a plurality of connection pins (not shown) including pin 18 is a standard integrated circuit having a standard cell, semi-custom electronic circuit 12 providing certain features as required by the particular application, here a high speed application. One of the features provided by electronic circuit 12 is an internal fault signal 14. Due to switching noise or other phenomenon that may present a false internal fault signal, fault latch delay circuit 100 is provided to reduce the possibility of an erroneous fault signal.

Fault latch delay circuit 100 includes internal circuitry 110 which is circuitry internal to the integrated circuit 10 and external circuitry 120 which is circuitry external to the integrated circuit 10 such external circuitry 120 connected to the internal circuitry 110 using pin 18 of the integrated circuit 10, said pin 18 also providing the external fault signal 30. Internal circuitry 110 includes current source 16, comparator 20, latch 22 and MOSFET 24. External circuitry 120 includes resistor 26 and capacitor 28. As shown in FIG. 1, the internal fault signal 14 provided by electronic circuit 12 is connected to current source 16. The other side of current source 16 is connected to pin 18 of the integrated circuit 10 as well as to one of the inputs of comparator 20. The other input of comparator 20 is connected to a reference voltage. The output of comparator 20 is connected to an input of latch 22. Latch 22 also includes a reset input and a switchable output 22a that is connected to a gate of MOSFET 24. MOSFET 24 includes a drain that is connected to ground and a source that is connected to pin 18 and one of the inputs to comparator 20 as shown. The external circuitry 120 includes a resistor 26 with one end of the resistor 26 connected to voltage source Vcc and the other end connected to pin 18 of the integrated circuit 10. Completing the external circuitry 120 is the capacitor 28 with one end connected to ground and the other end connected to pin 18 of the integrated circuit 10.

Figure 2:
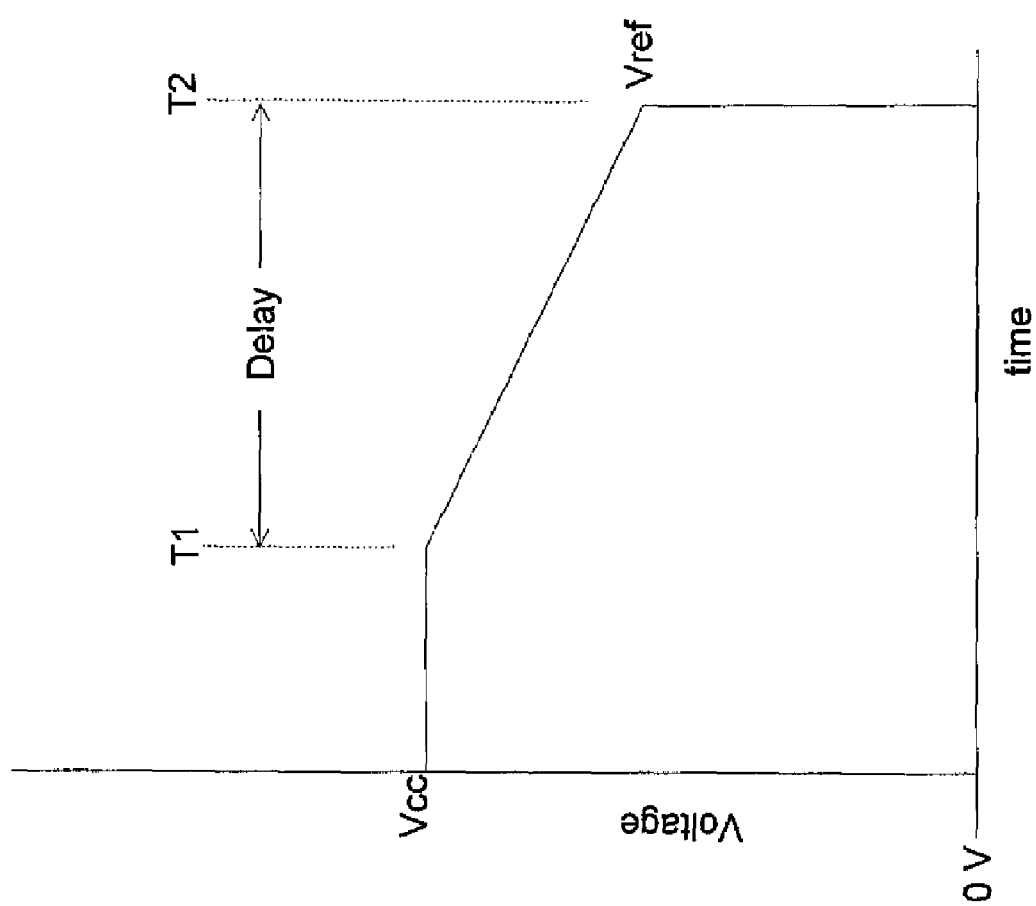
FIG. 2 is a timing diagram showing the voltage level at the fault pin of the integrated circuit.

In the normal mode of operation, when the internal fault signal 14 is high, MOSFET 24 is non-conductive, current source 16 is off (open circuit), and pin 18 is high having a voltage approximating Vcc, since the capacitor 28 is charged and no current is flowing in the circuit. When the internal fault signal 14 goes low, current source 16 turns on, capacitor 28 begins to discharge through current source 16 at a slew rate set by the size of the external capacitor 28. Referring now also to FIG. 2, the voltage at pin 18 at time T1 approximates Vcc, for example 5 volts, when the internal fault signal 14 goes low. As the capacitor continues to discharge, the voltage at pin 18 continues to decline until it reaches the voltage Vref, for example 3 volts, at time T2. Once the voltage at pin 18 falls below Vref, the output of comparator 20 transitions and provides a signal to the latch 22 which in turn activates the output 22a of latch 22 to turn on MOSFET 24, here an N-Channel MOSFET. With MOSFET activated, pin 18 is quickly pulled to ground as shown in FIG. 2 at time T2.

With such an arrangement, a time delay (T2–T1) may be introduced into the circuit to delay the time the fault indicator signal 14 is presented at the output of the integrated circuit to compensate for noise and other phenomenon that may appear as an erroneous fault indicator signal. The time delay can be set to be longer than the time duration of most transient noise signals to reduce the number of erroneous fault indicator signals. It should be appreciated that such an arrangement only requires a single pin of the integrated circuit 10 to be used where pin 18 is used to provide the external fault indication as well as set the time delay for the fault latch delay circuit 100.

It should now be appreciated an integrated circuit with a time delay circuit can be provided where a single pin of the integrated circuit can provide both a time delayed fault indication signal output and receive a reference signal to determine the period of time of the provided time delay and the period of the time delay can be set as required by an user as needed by a particular implementation of the integrated circuit.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims.

What is claimed is:

1. A time delay fault device comprising:
   an integrated circuit (IC) comprising:
   an electronic circuit having a fault indicator signal output;
   a time delay circuit having an input connected to the fault indicator signal output and an output to provide a delayed fault indicator signal output wherein the time delay circuit is responsive to an external reference signal from a resistor capacitor network coupled to the delayed fault indicator signal output to set the time delay of the delayed fault indicator signal.

2. The time delay fault device as recited in claim 1 wherein the time delay circuit comprises:
   a fixed current source to ground that toggles with an internal fault signal;
   a field effect transistor having a gate, a drain connected to ground, and a source connected to the output of the time delay circuit;
   a latch having an input and a switchable output connected to the gate of the field effect transistor; and
   a comparator having an output connected the input of the latch and a first and a second input, the first input connected to an internal reference signal and the second input connected to the output of the time delay circuit.

3. The time delay fault device as recited in claim 2 further comprising:
   a resistor capacitor network external to the integrated circuit comprising a capacitor connected in series with a resistor to complete the time delay circuit.

4. A time delay fault device comprising:
   an integrated circuit (IC) comprising:
   an electronic circuit having a fault indicator signal output;
   a time delay circuit having an input connected to the fault indicator signal output and an output to provide a delayed fault indicator signal output, wherein the time delay circuit is responsive to an external reference signal from a resistor capacitor network coupled to the delayed fault indicator signal output to set the time delay of the delayed fault indicator signal, the time delay circuit comprising:
   a fixed current source to ground that toggles with an internal fault signal;
   a field effect transistor having a gate, a drain connected to ground, and a source connected to the output of the time delay circuit;
   a latch having an input and a switchable output connected to the gate of the field effect transistor;
   a comparator having an output connected the input of the latch and a first and a second input, the first input connected to an internal reference signal and the second input connected to the output of the time delay circuit.

5. The time delay fault device as recited in claim 4 comprising a resistor capacitor network external to the integrated circuit comprising a capacitor connected in series with a resistor to complete the time delay circuit.

6. A time delay fault device comprising:
   an integrated circuit (IC) comprising:
   an electronic circuit having a fault indicator signal output;
   a time delay circuit having an input connected to the fault indicator signal output and an output to provide a delayed fault indicator signal output, wherein the time delay circuit is responsive to an external reference signal from a resistor capacitor network coupled to the delayed fault indicator signal output to set the time delay of the delayed fault indicator signal, the time delay circuit comprising:
   a fixed current source to ground that toggles with an internal fault signal;
   a field effect transistor having a gate, a drain connected to ground, and a source connected to the output of the time delay circuit;
   a latch having an input and a switchable output connected to the gate of the field effect transistor;
   a comparator having an output connected the input of the latch and a first and a second input, the first input connected to an internal reference signal and the second input connected to the output of the time delay circuit; and
   a resistor capacitor network external to the integrated circuit comprising a capacitor connected in series with a resistor to complete the time delay circuit.

* * * * *

UNITED STATES PATENT AND TRADEMARK OFFICE
CERTIFICATE OF CORRECTION

PATENT NO. : 7,573,393 B2
APPLICATION NO. : 11/672739
DATED : August 11, 2009
INVENTOR(S) : Haas et al.

It is certified that error appears in the above-identified patent and that said Letters Patent is hereby corrected as shown below:

Col. 1, line 59, delete "connected the" and replace with -- connected to the --.

Col. 3, line 28, delete "an" and replace with -- a --.

Col. 3, line 59, delete "connected the" and replace with -- connected to the --.

Col. 4, line 25, delete "connected the" and replace with -- connected to the --.

Col. 4, line 53, delete "connected the" and replace with -- connected to the --.

Signed and Sealed this

Sixth Day of October, 2009

David J. Kappos
*Director of the United States Patent and Trademark Office*